United States Patent
Chin et al.

(10) Patent No.: US 9,310,417 B2
(45) Date of Patent: Apr. 12, 2016

(54) USING TIME-DOMAIN REFLECTOMETRY TO IDENTIFY MANUFACTURING INFORMATION FOR A PASSIVE PRINTED CIRCUIT BOARD

(71) Applicant: Lenovo Enterprise Solutions (Singapore) Pte. Ltd., Singapore (SG)

(72) Inventors: Jordan HP Chin, Cary, NC (US); Timothy M. Wiwel, Raleigh, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 146 days.

(21) Appl. No.: 14/036,712

(22) Filed: Sep. 25, 2013

(65) Prior Publication Data

US 2015/0082628 A1    Mar. 26, 2015

(51) Int. Cl.
*G01R 31/11*   (2006.01)
*H05K 3/10*    (2006.01)
(Continued)

(52) U.S. Cl.
CPC ............ *G01R 31/11* (2013.01); *G01R 31/2805* (2013.01); *H05K 1/0268* (2013.01); *G01R 31/2818* (2013.01); *H05K 1/0248* (2013.01); *H05K 3/0047* (2013.01); *H05K 2201/09263* (2013.01); *H05K 2201/09618* (2013.01);
(Continued)

(58) Field of Classification Search
CPC ............... G01R 31/2805; G01R 31/11; G01R 31/2818; H05K 3/0047; H05K 3/10; H05K 1/0248; H05K 1/0268; H05K 2201/09263
USPC ............................ 29/830–831, 846–847, 852; 174/262–265; 702/58; 716/133
See application file for complete search history.

(56) References Cited

U.S. PATENT DOCUMENTS 7,409,668 B2 *   8/2008   Lin et al. ......................... 716/133
8,508,248 B1 *   8/2013   Chengson ................ 324/763.01
(Continued)

FOREIGN PATENT DOCUMENTS

JP    2000241451 A    9/2000
JP    2002005959 A    1/2002

OTHER PUBLICATIONS

Kim, GT et al., "Impedance measurement apparatus for printed circuit board", KR 2001057333A English Abstr, Dec. 22, 1999, 2 pages.
(Continued)

*Primary Examiner* — Minh Trinh
(74) *Attorney, Agent, or Firm* — Katherine S. Brown; Jeffrey L. Streets

(57) ABSTRACT

A method uses time-domain reflectometry to measure a signal reflection delay in a conductive trace formed on a specific passive printed circuit board, and uses the measured signal reflection delay as an index into a table storing a predetermined association between signal reflection delay and passive printed circuit board manufacturing information, wherein the table includes a plurality of predetermined signal reflection delay values, and wherein each of the predetermined signal reflection delay values is associated with unique passive printed circuit board manufacturing information. During manufacturing of the passive printed circuit board, a hole is drilled through the passive printed circuit board so that the hole intersects with the conductive trace and divides the conductive trace into a proximal segment extending from the connector to the hole and a distal segment that is electrically isolated from the proximal segment by the hole.

10 Claims, 5 Drawing Sheets

(51) Int. Cl.
*G01R 31/28* (2006.01)
*H05K 3/00* (2006.01)
*H05K 1/02* (2006.01)

(52) U.S. Cl.
CPC ............... *H05K2201/09627* (2013.01); *H05K 2201/09781* (2013.01); *H05K 2203/163* (2013.01); *H05K 2203/171* (2013.01); *H05K 2203/175* (2013.01); *Y10T 29/49155* (2015.01)

(56) References Cited

U.S. PATENT DOCUMENTS

| | | | |
|---|---|---|---|
| 2003/0038639 A1 | 2/2003 | Wallace et al. | |
| 2003/0090273 A1 | 5/2003 | Hauptner et al. | |
| 2003/0218463 A1* | 11/2003 | Stierman et al. | 324/534 |
| 2004/0130334 A1 | 7/2004 | Sparkman | |
| 2009/0322350 A1* | 12/2009 | Aygun et al. | 324/642 |
| 2010/0250158 A1* | 9/2010 | McElfresh et al. | 702/58 |
| 2011/0267287 A1 | 11/2011 | Bartling et al. | |
| 2012/0274338 A1* | 11/2012 | Baks et al. | 324/617 |
| 2013/0181737 A1* | 7/2013 | Liu et al. | 324/763.01 |

OTHER PUBLICATIONS

Yoshiki Kayano "Common-Mode Current Due to a Trace Near a PCB Edge and Its Suppression by a Guard Band", IEEE Transactions on Electromagnetic Compatibility, vol. 46, No. 1, Feb. 2004, pp. 46-53.
M. P. James et al., "Design and evaluation of controlled impedance PCBs for high frequency applications", ElectroMagnetic Interference and Compatibility (INCEMIC), 2006 Proceedings of the 9th International Conference on , vol., No., pp. 25-30, Feb. 23-24, 2006.
Purisima et al., "FPGA Implementation of a Time Domain Reflectometry (TDR) System for Slope Monitoring Applications", IEEE Xplore—FPGA implementation of a Time Domain Reflectometry (TDR) system, Nov. 21-24, 2010, 7 pages.

* cited by examiner

USING TIME-DOMAIN REFLECTOMETRY TO IDENTIFY MANUFACTURING INFORMATION FOR A PASSIVE PRINTED CIRCUIT BOARD

BACKGROUND

1. Field of the Invention

The present invention relates to the design, manufacture and use of passive printed circuit boards.

2. Background of the Related Art

Currently there is no cost effective way for a system management device (IMM, BMC, etc) to track or read PCB manufacturing information (build date, lot number, etc) on cards with no active components (such as a EEPROM, programmable logic, or micro-controller). Cards that meet this billing are typically mid-planes boards that are designed for high reliability and wish not to use active components that may compromise failure rates. Typically these boards only have press fit connectors on them. One step further, these cards typically do not go through a solder process.

The most commonly accepted solution to this problem is the creation and use of a "personality" card. A personality card is a smaller separate card with an EEPROM that is attached to the passive board with a connector and stores the mid-plane's vital product data. The use of a personality card is an expensive way to identify manufacturing information about a PCB, because it requires an additional connector set and development/production costs associated with the personality card.

BRIEF SUMMARY

One embodiment of the present invention provides a method, comprising using time-domain reflectometry to measure a signal reflection delay in a conductive trace formed on a specific passive printed circuit board, and using the measured signal reflection delay as an index into a table storing a predetermined association between signal reflection delay and passive printed circuit board manufacturing information, wherein the table includes a plurality of predetermined signal reflection delay values, and wherein each of the predetermined signal reflection delay values is associated with unique passive printed circuit board manufacturing information.

Another embodiment of the present invention provides a method of manufacturing passive printed circuit boards. The method comprises forming a plurality of passive printed circuit boards, wherein each passive printed circuit board has a conductive trace. Each conductive trace has a proximal end in electrical communication with a connector, a distal end, and the same length and continuous pathway from the proximal end to the distal end. The method further comprises selecting a position for drilling a hole in one of the passive printed circuit boards, wherein the position is selected from a plurality of predetermined positions spaced apart along the length of the conductive trace. Each predetermined position is used to indicate manufacturing information about the passive printed circuit board. Still further, the method comprises drilling a hole through the passive printed circuit board so that the hole intersects with the conductive trace and divides the conductive trace into a proximal segment extending from the connector to the hole and a distal segment that is electrically isolated from the proximal segment by the hole.

DETAILED DESCRIPTION

Figure 1:
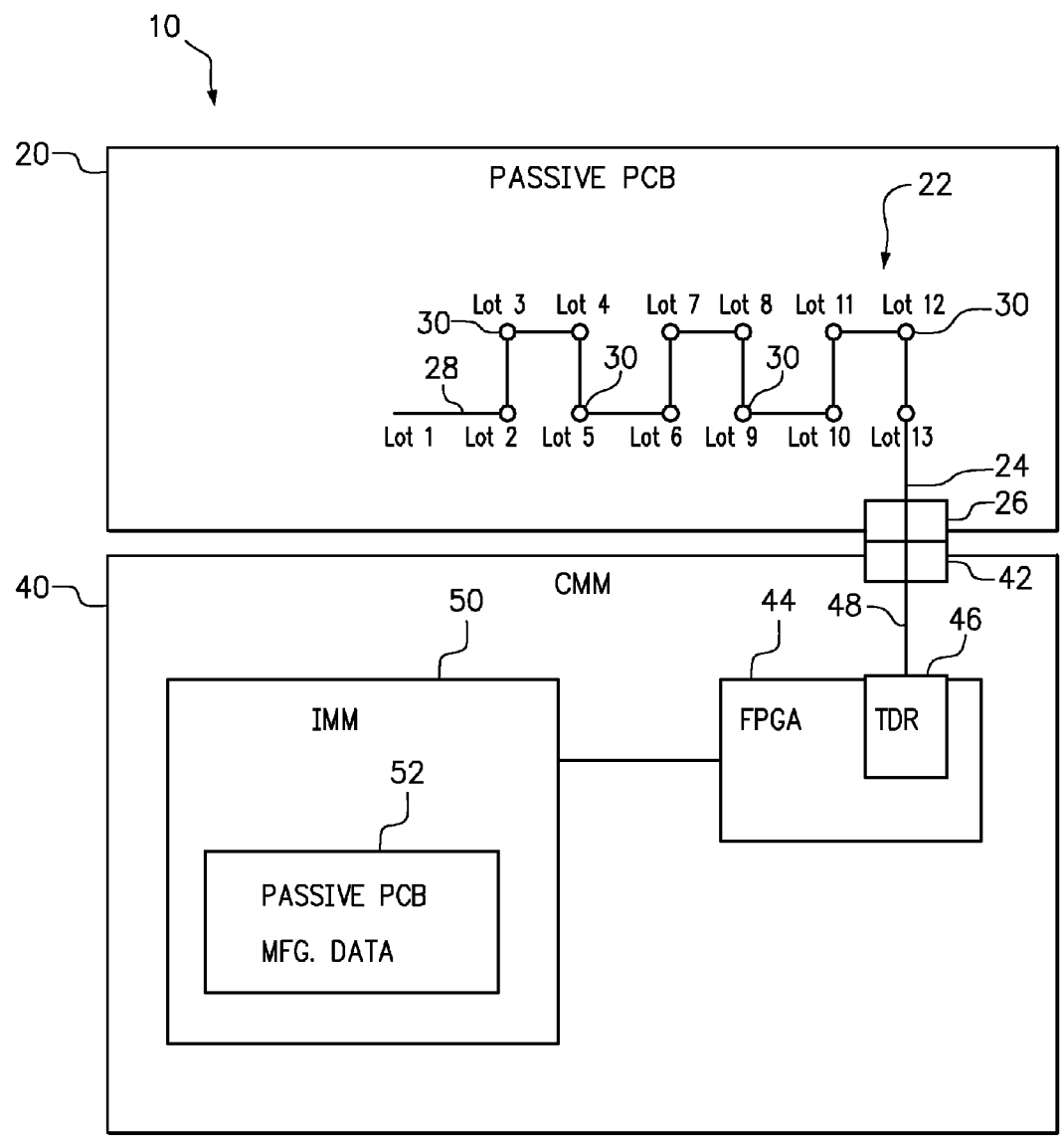
FIG. 1 is a diagram of a passive printed circuit board connected to a chassis management module.

One embodiment of the present invention provides a method, comprising using time-domain reflectometry to measure a signal reflection delay in a conductive trace formed on a specific passive printed circuit board, and using the measured signal reflection delay as an index into a table storing a predetermined association between signal reflection delay and passive printed circuit board manufacturing information, wherein the table includes a plurality of predetermined signal reflection delay values, and wherein each of the predetermined signal reflection delay values is associated with unique passive printed circuit board manufacturing information.

Time-domain reflectometry (TDR) is a measurement technique that is used to determine the characteristics of electrical lines by observing reflected waveforms. The amount of time required for an emanated pulse or signal to reach the reflecting impedance (i.e., the hole) and return to the TDR circuit is be referred to herein as "signal reflection delay." For example, the plurality of predetermined signal reflection delay values may correspond to the conductive trace being terminated at any of a plurality of predetermined positions spaced apart in uniform increments along the length of the conductive trace.

The table may be stored in any suitable data structure and is not limited to a spreadsheet type structure of columns and rows. However, the table may be referred to as have a plurality of records, where each record has a plurality of data fields. Accordingly, the table may include a separate record for each of plurality of predetermined signal reflection delay values. Each signal reflection delay may be uniquely associated with a particular record which includes passive printed circuit board manufacturing information. The passive printed circuit board manufacturing information may, for example and without limitation, include or identify a manufacturing lot number or a printed circuit board type.

In a further embodiment, the method may further comprise coupling the passive printed circuit board to an active printed circuit board through a connector. Accordingly, the connector provides electronic communication between the conductive trace on the passive printed circuit board and a programmable logic device, such as a field-programmable gate array, on the active printed circuit board. The programmable logic device is then responsible for performing the time-domain reflectometry to measure the signal reflection delay. In one example, the passive printed circuit board is a midplane and the active printed circuit board is a chassis management module.

In one example, a field-programmable gate array (FPGA) is configured to take time-domain reflectometry (TDR) measurements from a proximal end of the conductive trace. The FPGA can measure the amount of time that it takes for a signal (pulse) generated at the proximal end of the conductive trace to reflect and return to the FPGA. The FPGA may include latches that enable the FPGA to provide a simple timer, for example a timer that can run at 500 Mhz.

In another example, the active printed circuit board includes an integrated management module in electronic communication with the field-programmable gate array for receiving the measured signal reflection delay. Optionally, the integrated management module has access to memory storing the table. After the integrated management module receives the measured signal reflection, the integrated management module may, for example, identify the passive printed circuit board manufacturing information to one or more nodes connected to the passive printed circuit board. Furthermore, the passive printed circuit board manufacturing information associated with the measure signal reflection delay may be used to improve performance of a system including the passive printed circuit board. For example, the passive printed circuit board may be a midplane and the one or more nodes may be blade servers.

Another embodiment of the present invention provides a method of manufacturing passive printed circuit boards. The method comprises forming a plurality of passive printed circuit boards, wherein each passive printed circuit board has a conductive trace. Each conductive trace has a proximal end in electrical communication with a connector, a distal end, and the same length and continuous pathway from the proximal end to the distal end. The method further comprises selecting a position for drilling a hole in one of the passive printed circuit boards, wherein the position is selected from a plurality of predetermined positions spaced apart along the length of the conductive trace. The selected position of the hole is used to indicate manufacturing information about the passive printed circuit board. Still further, the method comprises drilling a hole through the passive printed circuit board so that the hole intersects with the conductive trace and divides the conductive trace into a proximal segment extending from the connector to the hole and a distal segment that is electrically isolated from the proximal segment by the hole.

The plurality of predetermined positions are preferably spaced apart in uniform increments. Accordingly, selecting the position for drilling a hole from among the predetermined positions will assure that the measured signal reflection delay associated with the conductive trace will be easily distinguishable from other signal reflection delays.

After manufacturing the passive printed circuit board, the selected position of the hole is determinable by using time-domain reflectometry to measure a signal reflection delay in the proximal segment of the conductive trace through the connector. Preferably, manufacturing information about the passive printed circuit board is identifiable using the measured signal reflection delay as an index into a table storing a predetermined association between signal reflection delay and passive printed circuit board manufacturing information. Furthermore, the table may include a plurality of predetermined signal reflection delay values, such that each of the predetermined signal reflection delay values is associated with unique passive printed circuit board manufacturing information.

Each passive printed circuit board is designed and manufactured with a conductive trace extending to a connector, such as a connector to another printed circuit board. For example, the passive printed circuit board may be a midplane and the other printed circuit board may be a chassis management module. A programmable logic device capable of time-domain reflectometry (TDR) is provided on the other printed circuit board and in electronic communication with the conductive trace through the connector. Using TDR, an amount of signal reflection delay is a function of the length of the total electrically conductive path length from the programmable logic device through the connector and along the conductive trace. This total length can be shortened by drilling a hole through the conductive trace.

In various embodiments, the conductive trace may include conductive vias spaced apart along the length of the conductive trace in the plurality of predetermined positions. The conductive via at the selected position of the "hole" is then back drilled to remove the conductive metal within that particular via. This embodiments is particularly convenient when the passive printed circuit board already requires a back drill process, such as to improve the signal quality associated with via stubs elsewhere on the passive printed circuit board.

In use, the programmable logic device on the active printed circuit board will take TDR measurements of the conductive trace on the passive printed circuit board and the TDR measurements will be used as an index into a lookup table that contains the predetermined TDR values associated with predetermined manufacturing data. A service processor or integrated management module (IMM) can read and log either the TDR measurements or the manufacturing information from the programmable logic device, and make it accessible to service technicians and product engineers.

The present invention allows a high-reliability printed circuit board to be designed and manufactured without any active components on the board and without a separate personality card that needs to be secured to the board. In accordance with embodiments of the present invention, the foregoing benefits may be achieved while providing a method and apparatus for identifying manufacturing information about the board.

The conductive trace can be located on any one or more of the layers of the passive PCB. After forming the conductive trace, the length of the trace can be set by drilling a target hole or via through the PCB directly over the path of the conductive trace so that a distal end of the conductive trace is disconnected from the rest of the conductive trace. The modified length of the conductive trace establishes a signal reflection time in the remaining portion of the conductive trace.

The entirety of the conductive trace should be long enough to define a plurality of identifiable points at which the target hole may be drilled, where each of the identifiable points are spaced apart so that the signal reflection time resulting from drilling the hole at any one of the identifiable points can be easily distinguished from the signal reflection time resulting from drilling the hole at any of the other identifiable points.

In one embodiment, the conductive trace is part of a midplane, and the FPGA and IMM are located on a card that plugs into the midplane. For example, the FPGA and the IMM may be part of a chassis management module that plugs into the midplane. One of the conductors, such as a ground wire, in an existing connector from the midplane to the CMM may be used to establish communication between the FPGA and the conductive trace.

FIG. 1 is a diagram of a system 10 including a passive printed circuit board 20 connected to a chassis management module 40. The passive printed circuit board 20 includes a conductive trace 22 having a proximal end 24 in electrical communication with a connector 26 and a distal end 28. Regardless of the manufacturing lot or PCB type, each of a plurality of such printed circuit boards 20 should have the same length and continuous pathway from the proximal end to the distal end. For the specific passive printed circuit boards 20 shown, a hole (not shown) will have been drilled at one of the predetermined positions 30 (twelve shown) spaced apart along the length of the conductive trace 22. Each predetermined position, as well as the entirety of the length of the conductive trace, may be used to indicate manufacturing information about the passive printed circuit board 20, such as a manufacturing lot number. As previously described, a hole is drilled through the passive printed circuit board 20 so that the hole intersects with the conductive trace 22 and divides the conductive trace into a proximal segment extending from the connector 26 to the hole and a distal segment that is electrically isolated from the proximal segment by the hole.

The system 10 also includes an active printed circuit board, such as a chassis management module (CMM) 40, which is connected to the passive printed circuit board 20 by a connector 42. The CMM 40 includes a field-programmable gate array (FPGA) 44 that provides the circuit 46 to perform time-domain reflectometry (TDR). A conductive trace 48 extends from the TDR circuit 46 to the connector 42. In operation, the TDR 46 generates a signal or pulse into the conductive trace 48, which is conducted through the connectors 42, 26 to the proximal end 24 of the conductive trace 22 on the passive printed circuit board 20. The signal reflection delay includes the amount of time that is required for the signal or pulse to travel from the TDR 46, through the connectors 42, 26, along the conductive trace 22 on the passive printed circuit board 20, reflect at a terminal end of the conductive trace 22 (as determined by the position of any drilled hole), and return to the TDR 46.

The FPGA 44 communicates the measured signal reflection delay to the integrated management module (IMM) 50. In the embodiment shown, the IMM 50 stores a table 52 of manufacturing information or vital product data for a plurality of passive printed circuit boards. Accordingly, the position of a hole at one of the predetermined positions 30 is determinable using TDR 46, and the measured signal reflection delay can be used by the IMM 50 to lookup manufacturing information associated with the passive printed circuit board 20.

Figure 2:
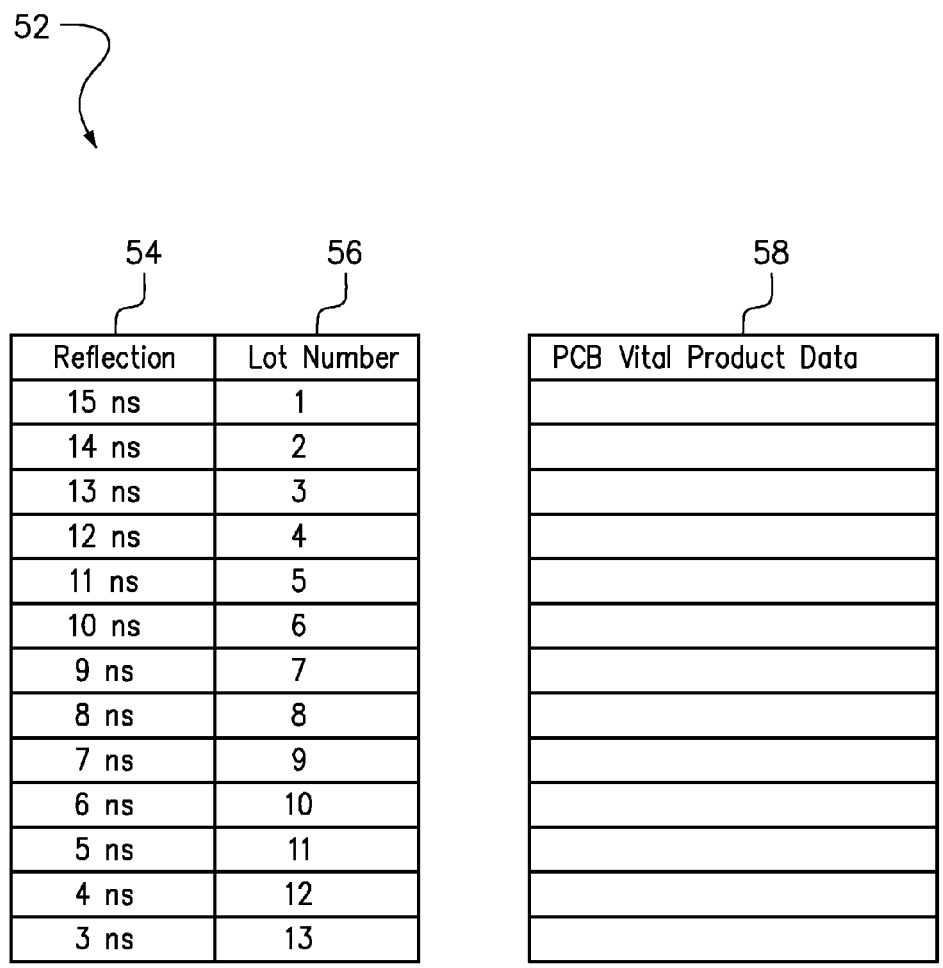
FIG. 2 is a table storing a correlation between signal reflection time and a manufacturing lot number or additional printed circuit board vital product data.

FIG. 2 is an example of the table 52 that stores a correlation between signal reflection time (column/field 54) and a manufacturing lot number (column/field 56) or additional printed circuit board vital product data (column/field 58). In this embodiment, if no hole is drilled to bifurcate the conductive trace (conductive trace 22 of FIG. 1), then the signal reflection delay is 15 nanoseconds (ns). The record (row) with a signal reflection delay of 15 ns has a predetermined association (i.e., within the same record) with manufacturing lot number 1. Optionally, PCB vital product data may also have a predetermined association with this record, whether the data is in the same table stored by the IMM or some other table stored on the IMM or some other component.

Drilling a hole through the conductive trace at one of the predetermined position will shorten the effective length of the conductive trace (i.e., the proximal segment of the conductive trace), such that the signal reflection delay is proportionally reduced. In this example, drilling a hole at a first predetermined position 30 (labelled "Lot 2" in FIG. 1) will result in a signal reflection delay of 14 ns, which associates the PCB with Lot 2 (see column/field 56). Each record in the table 52 is uniquely identifiable by which one (or if any) of the predetermined positions has been drilled.

Figure 3A:
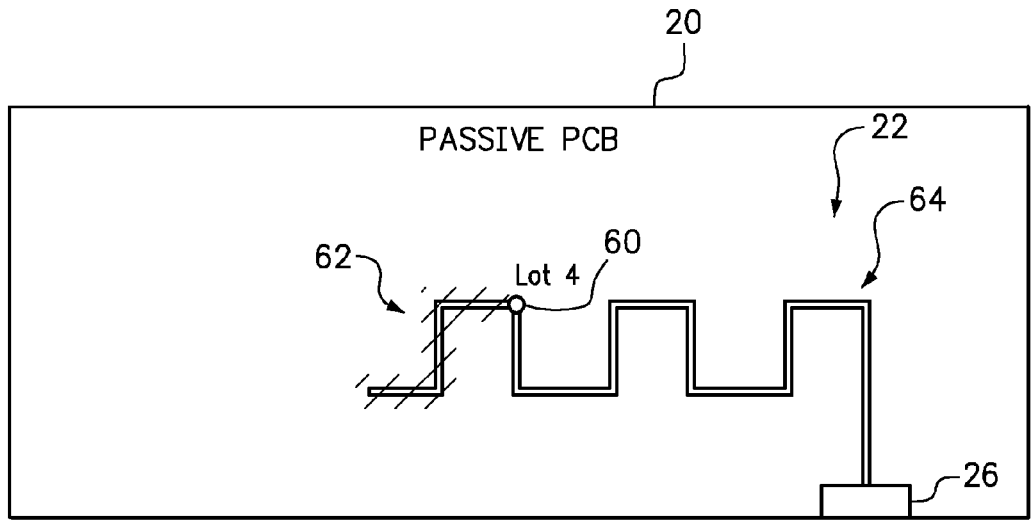
FIGS. 3A and 3B are diagrams of a conductive trace manufactured into the printed circuit board and a selected hole drilled through the conductive trace to identify manufacturing data related to the printed circuit board.
Figure 3B:
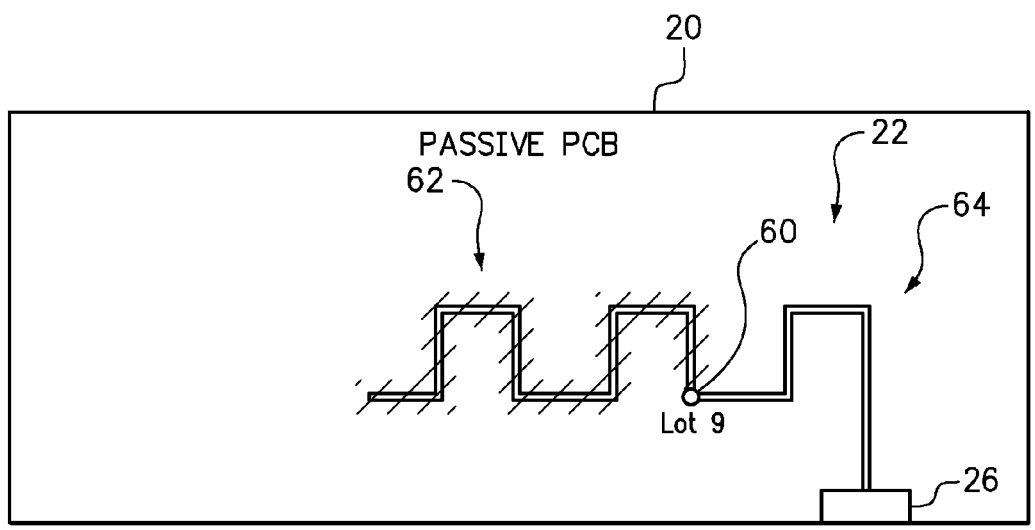

FIGS. 3A and 3B are diagrams of a conductive trace 22 manufactured into the passive printed circuit board 20 and a selected hole 60 drilled through the passive printed circuit board 20 and the conductive trace 22 to identify manufacturing data related to the printed circuit board. Since the hole 60 is aligned with the conductive trace 22 and wider than the conductive trace 22, the hole effectively cuts or divides the conductive trace 22 so that there is no electrical communication between a distal segment. Although the CMM 40 is not shown in FIGS. 3A and 3B, it should be recognized that for purposes of this example the CMM 40 and its FGPA 44 and 50 would be connected in the manner shown in FIG. 1.

In FIG. 3A, the hole 60 has been drilled at one of the predetermined positions associated with "Lot 4", such that a distal segment 62 (identified by cross-hatching) is no longer in electrical communication with a proximal segment 64 (identified by no cross-hatching). This results in a measured signal reflection delay of 12 ns, which has a predetermined association with "Lot 4" in table 52 of FIG. 2.

In FIG. 3B, the hole 60 has been drilled at one of the predetermined positions associated with "Lot 9", such that a distal segment 62 (identified by cross-hatching) is no longer in electrical communication with a proximal segment 64 (identified by no cross-hatching). This results in a measured signal reflection delay of 7 ns, which has a predetermined association with "Lot 4" in table 52 of FIG. 2.

Figure 4A:
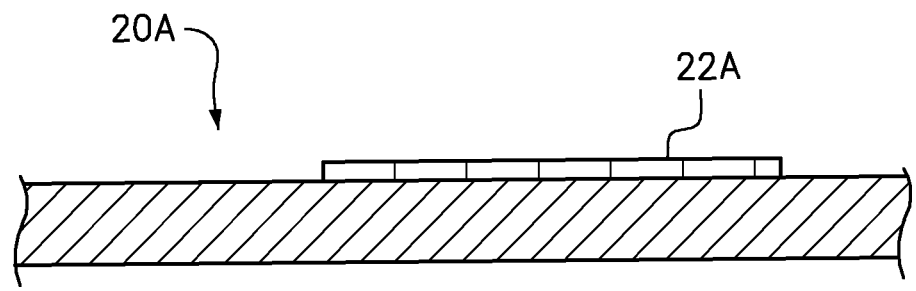
FIGS. 4A-4C are side view of printed circuit boards having a conductive trace on a top surface of the PCB, within an internal layer of the PCB, and some combination of PCB layers.
Figure 4B:
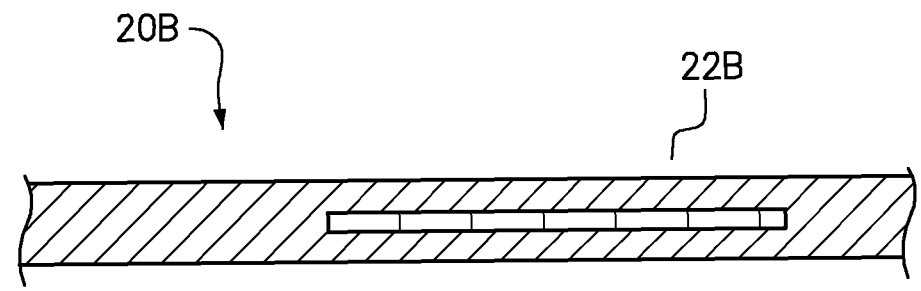
Figure 4C:
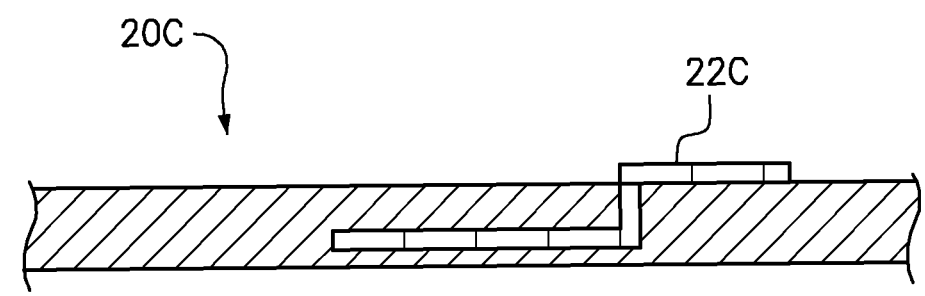

FIGS. 4A-4C are side views of printed circuit boards 20A-20C having a conductive trace 22A-22C. In FIG. 4A, the conductive trace 22A is located on a top surface of the PCB 20A. In FIG. 4B, the conductive trace 22B is located within an internal layer of the PCB 20B. In FIG. 4C, the conductive trace 22C is located on/within a combination of layers of the PCB 20C. Any of these embodiments are functional in accordance with one or more embodiments of the present invention, since a hole drilled through the PCB will still be effective to cut or divide the conductive trace as described herein. Furthermore, any additional length of the conductive trace that is due to a conductive via that allows the conductive trace to extend within a combination of layers may be taken into account either by changing the predetermined positions or modifying the signal reflection delay data stored in the table.

Figure 5A:
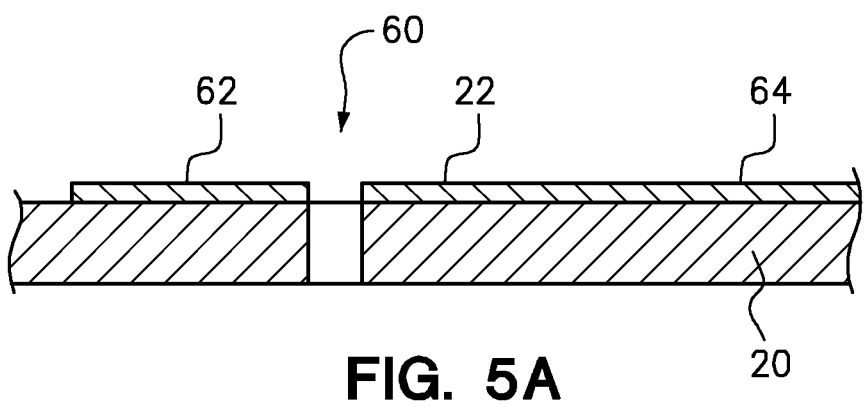
FIGS. 5A and 5B are cross-sectional side views of passive printed circuit board having a conductive trace manufactured into the printed circuit board and a selected hole drilled through the conductive trace to identify manufacturing data related to the printed circuit board.
Figure 5B:
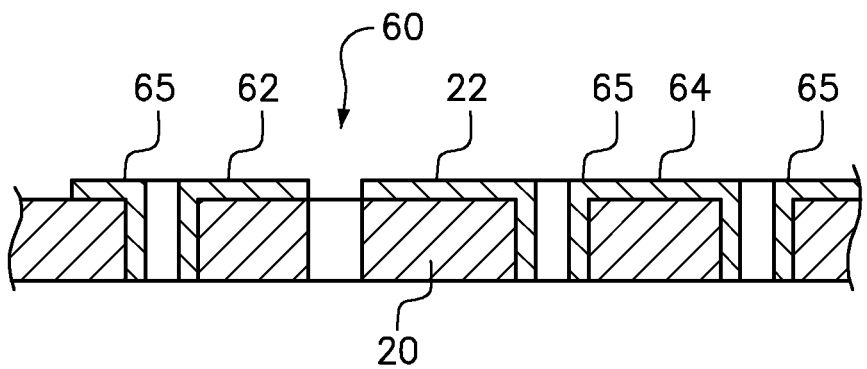

FIGS. 5A and 5B are cross-sectional side views of passive printed circuit board having a conductive trace manufactured into the printed circuit board and a selected hole drilled through the conductive trace to identify manufacturing data related to the printed circuit board. In FIG. 5A, a hole 60 has been drilled through the conductive trace 22 at the selected position on the passive printed circuit board 20, such that a distal segment 62 is no longer in electrical communication with a proximal segment 64. In FIG. 5B, the conductive trace 22 includes a conductive vias 65 spaced apart along the length of the conductive trace in the plurality of predetermined positions. The conductive via at the selected position of the hole 60 has been back drilled to remove the conductive metal within that particular via. Accordingly, a distal segment 62 is no longer in electrical communication with a proximal segment 64.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention may be described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for identifying manufacturing information about a passive printed circuit board, comprising:

providing a field-programmable gate array on an active printed circuit board, wherein the field-programmable gate array includes a time-domain reflectometry device to measure signal reflection delay;

coupling the passive printed circuit board to the active printed circuit board through a connector, wherein the connector provides electronic communication between a conductive trace on the passive printed circuit board and the field-programmable gate array on the active printed circuit board;

measuring a signal reflection delay in the conductive trace formed on the passive printed circuit board using the time-domain reflectometry device on the active printed circuit board; and identifying manufacturing information about the passive printed circuit board using the measured signal reflection delay as an index into a table storing a predetermined association between signal reflection delay and passive printed circuit board manufacturing information, wherein the table includes a plurality of predetermined signal reflection delay values, and wherein each of the predetermined signal reflection delay values is associated with passive printed circuit board manufacturing information.

2. The method of claim 1, wherein the passive printed circuit board manufacturing information includes a manufacturing lot number.

3. The method of claim 1, wherein the passive printed circuit board manufacturing information includes a printed circuit board type.

4. The method of claim 1, further comprising:
using the passive printed circuit board manufacturing information associated with the measure signal reflection delay to improve performance of a system including the passive printed circuit board.

5. The method of claim 1, wherein the passive printed circuit board is a midplane and the active printed circuit board is a chassis management module.

6. The method of claim 1, wherein the active printed circuit board includes an integrated management module in electronic communication with the field-programmable gate array for receiving the measured signal reflection delay.

7. The method of claim 6, wherein the integrated management module has access to memory storing the table.

8. The method of claim 7, further comprising:
the integrated management module identifying the passive printed circuit board to one or more nodes connected to the passive printed circuit board.

9. The method of claim 1, wherein the time-domain reflectometry (TDR) device uses a signal at about 500 Mhz.

10. The method of claim 1, wherein the plurality of predetermined signal reflection delay values correspond to the conductive trace being terminated at any of a plurality of predetermined positions spaced apart in uniform increments along the length of the conductive trace.

\* \* \* \* \*